(12) United States Patent
Chen

(10) Patent No.: US 7,494,765 B2
(45) Date of Patent: *Feb. 24, 2009

(54) METHOD FOR PATTERNING PHOTORESIST PILLARS USING A PHOTOMASK HAVING A PLURALITY OF CHROMELESS NONPRINTING PHASE SHIFTING WINDOWS

(75) Inventor: Yung-Tin Chen, Santa Clara, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/559,620

(22) Filed: Nov. 14, 2006

(65) Prior Publication Data

US 2007/0072094 A1 Mar. 29, 2007

Related U.S. Application Data

(62) Division of application No. 10/815,312, filed on Apr. 1, 2004, now abandoned.

(51) Int. Cl.
G03F 7/20 (2006.01)
G03F 7/40 (2006.01)

(52) U.S. Cl. .................. 430/311; 430/313; 430/319

(58) Field of Classification Search .......... 430/311, 430/313
See application file for complete search history.

(56) References Cited

U.S. PATENT DOCUMENTS 5,667,940 A * 9/1997 Hsue et al. .............. 430/313

6,461,774 B1 * 10/2002 Zimlich et al. ............ 430/5
7,172,840 B2 * 2/2007 Chen ....................... 430/311
2002/0140920 A1 * 10/2002 Rosenbluth et al. ........ 355/67
2004/0101764 A1 * 5/2004 Nyhus et al. ............... 430/5

OTHER PUBLICATIONS

Graf, Rudolf F., Modern Dictionary of Electronics, 1992, SAMS—A Division of Prentice Hall Computer Publishing, 6th Edition, p. 764.*

* cited by examiner

Primary Examiner—Mark F Huff
Assistant Examiner—John Ruggles
(74) Attorney, Agent, or Firm—Dugan & Dugan, PC

(57) ABSTRACT

A method for patterning a photoresist using a photomask to form an integrated circuit, the photomask including a first area transmitting light in a first phase surrounded by a second area, the second area transmitting light in a second phase, the second phase opposite the first phase. No blocking material separates the first area from the second area. After development of the photoresist, the transition along a perimeter between the first and the second area causes formation of a residual photoresist feature on the photoresist surface due to phase canceling of light. If the first area is small enough, it is nonprinting, i.e., the opposite sides of the residual photoresist feature formed at its perimeter merge, forming a contiguous photoresist feature, such as a pillar, and thus a corresponding patterned feature or pillar after etching (e.g., to form a portion of a memory cell, etc.).

9 Claims, 14 Drawing Sheets

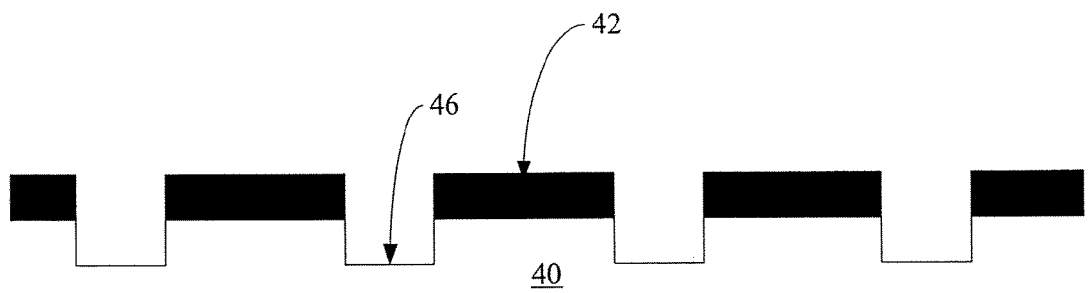
Fig. 12c
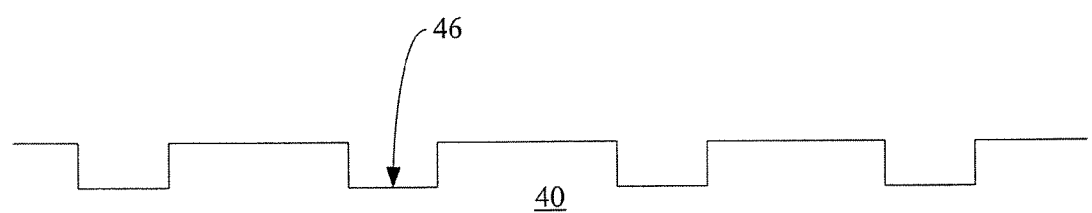
Fig. 12d
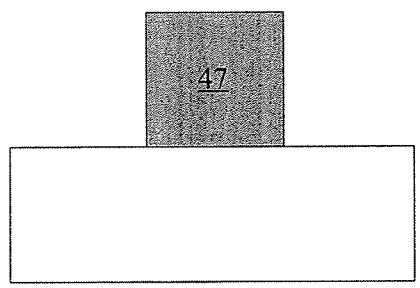 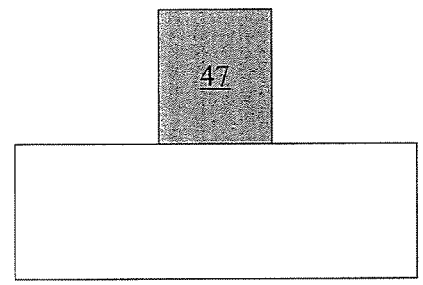
Fig. 13a　　　　　　　　　　Fig. 13b Conventional Annular Quadrapole Dipole

METHOD FOR PATTERNING PHOTORESIST PILLARS USING A PHOTOMASK HAVING A PLURALITY OF CHROMELESS NONPRINTING PHASE SHIFTING WINDOWS

This is a divisional (DIV) application of Ser. No. 10/815,312 filed on Apr. 1, 2004 now abandoned.

BACKGROUND OF THE INVENTION

The invention relates to a method for patterning fine features for semiconductor devices using a phase shifting mask with no blocking material separating the opposite phases.

Patterned features making up integrated circuits are conventionally formed using photolithography and etch techniques. A photomask, which transmits light in some areas and blocks it in others, is formed, the blocking areas corresponding to the pattern to be formed on the wafer surface (or its inverse.) The surface to be patterned, for example a semiconductor or dielectric layer, is covered with a layer of photoresist, a photoreactive material. Light is projected onto the photoresist surface using the photomask, selectively exposing areas of photoresist. The wafer is then subjected to a developing process, in which exposed photoresist (or unexposed photoresist, in the case of negative photoresist) is removed, leaving patterned photoresist behind.

The remaining patterned photoresist then typically serves to protect underlying material during a subsequent etch process, creating features in the same pattern as the remaining photoresist.

Over the years integrated circuits have become denser and patterned features smaller. As projected features become smaller, the limits of resolution are reached and it becomes more difficult to project patterns with sharp edges. Poor resolution can lead to incomplete patterning and to incomplete etching or overetching, causing device flaws.

Alternating phase shifters, which invert the phase of light in some areas of the photomask, increasing contrast in light intensity at the photoresist surface, are a powerful tool to improve resolution and sharpen edges.

The use of alternating phase shifters in photomasks, however, has disadvantages. When alternating phase shifters are used, projected light is either incident, in what will be called zero degree phase, or inverted, in what will be called 180 degree phase (this is sometimes also called $\pi$ phase.) As will be more fully described, as conventionally used, light in opposite phases is transmitted on opposite sides of an obscured area. The configuration of some patterns leads to phase conflicts, in which rules dictate that the same area must see light of opposite phases. To date, this has meant that use of alternating phase shifters has been limited to only certain types of patterns.

There is a need, therefore, for increased flexibility of phase shifting photomasks.

SUMMARY OF THE INVENTION

The present invention is defined by the following claims, and nothing in this section should be taken as a limitation on those claims. In general, the invention is directed to an improved method for using phase shifters in a photomask for photolithography.

A first aspect of the invention provides for a phase shifting photomask comprising a plurality of transmitting nonprinting windows transmitting light in a first phase; a transmitting area transmitting light in a second phase, each transmitting window substantially entirely surrounded by and in contact with the transmitting area with no blocking material intervening, wherein the second phase is substantially opposite the first phase, and wherein a first width of unbroken transmitting area surrounds each transmitting window on all sides, the first width sufficient for the unbroken transmitting area to print when the photomask is used to expose photoresist.

Another aspect of the invention provides for a phase shifting photomask comprising a transmitting nonprinting window transmitting light in a first phase; and a transmitting area substantially entirely surrounding and in contact with the transmitting window on all sides with no blocking material intervening, wherein the transmitting area transmits light in a second phase, the second phase substantially opposite the first phase, and wherein, when used to pattern photoresist, the transmitting area is printing on all sides of the transmitting window.

An embodiment of the invention provides for a phase shifting photomask comprising a plurality of spatially separate transmitting nonprinting windows transmitting light in a first phase; a transmitting area transmitting light in a second phase, the second phase substantially opposite the first, the transmitting area entirely surrounding and in contact with each of the transmitting windows of the first plurality; wherein each transmitting window is separated from its nearest neighbor in the plurality by an unbroken length of transmitting area having at least a first dimension, and wherein the smallest dimension of each window is no more than about 160 percent of the first dimension.

Yet another embodiment of the invention provides for a phase shifting photomask comprising a transmitting nonprinting window having a first shifting degree; a second transmitting area having a second shifting degree, the second transmitting area entirely surrounding and in contact with the first transmitting window, wherein the second transmitting area is printing on all sides of the transmitting window; and wherein the second shifting degree is substantially opposite the first shifting degree.

Another aspect of the invention provides for a method for forming a patterned feature on a wafer surface, the method comprising transmitting light through a phase shifting photomask onto photoresist covering the wafer surface; forming an isolated first residual photoresist feature between a first wafer area exposed to light in a first phase and a second wafer area exposed to light in a second phase, wherein the first phase is substantially opposite the second phase, and wherein the second wafer area entirely surrounds the first wafer area in the plane of the wafer; and forming the patterned feature from the photoresist feature.

Still another aspect of the invention provides for a method for forming photoresist features on a wafer surface using a photomask, the method comprising transmitting light through a first mask area onto a first wafer area, the first mask area having a first shifting degree; transmitting light through a second mask area onto a second wafer area, the second mask area having a second shifting degree, wherein the second mask area entirely surrounds and is on all sides in contact with the first mask area, and the first shifting degree is substantially opposite the second shifting degree; and developing photoresist, wherein, after the developing step, a closed residual photoresist feature remains between the first wafer area and the second wafer area, and wherein the closed residual photoresist feature is isolated and not merged with any adjacent photoresist feature.

Another aspect of the invention provides for a monolithic three dimensional memory array comprising a plurality of patterned features, the plurality of patterned features patterned using a photomask comprising: a plurality of spatially separate first transmitting windows, wherein the transmitting windows transmit light in a first phase; and a transmitting area of the photomask, each transmitting window substantially surrounded by and in contact with the transmitting area, wherein the transmitting area transmits light in a second phase, the second phase substantially opposite the first phase.

Each of the aspects and embodiments of the invention can be used alone or in combination with one another.

The preferred aspects and embodiments will now be described with reference to the attached drawings.

BRIEF DESCRIPTION OF THE DRAWINGS

FIG. 1b shows the electrical field in the plane of the photomask for the photomask of FIG. 1a.

FIG. 1c shows the light intensity at the surface of the photoresist for light projected through the photomask of FIG. 1a.

FIG. 2b shows the electrical field in the plane of the photomask for the photomask of FIG. 2a.

FIG. 2c shows the light intensity at the surface of the photoresist for light projected through the photomask of FIG. 2a.

FIG. 10c shows the electrical field in the plane of the photomask for the photomask of FIG. 10a.

FIG. 10d shows the light intensity at the surface of the photoresist for light projected through the photomask of FIG. 10a.

FIG. 10e shows, in cross section, residual photoresist features formed on the wafer surface using the photomask of FIG. 10a.

FIGS. 12a through 12d illustrate formation of a photomask formed according to the present invention.

FIGS. 13a and 13b show, in cross section, two projected photoresist features formed using the same photomask with different exposure doses.

DETAILED DESCRIPTION OF THE INVENTION

One approach to allow alternating phase shifting photomasks to be used to pattern a wider variety of shapes is taught in Chen, U.S. patent application Ser. No. 10/728,436, filed Dec. 5, 2003, now U.S. Pat. No. 7,172,840, issued Feb. 6, 2007, hereinafter the '840. The '840 patent is the work of the same inventor as the present invention, is owned by the assignee of the present invention, and is hereby incorporated by reference. The present invention is an improved method to solve the same problem.

The problem addressed by both the present invention and the '840 patent will be described.

The '840 patent used the term masked feature. A masked feature referred to a feature in a photomask, for example a line, a rectangle, or any other shape. A masked feature in a photomask substantially entirely or partially obscures light, so that when a light is projected through the photomask, a corresponding feature in the photoresist is shielded from light, while the area outside of the obscured area is exposed. This corresponding feature in photoresist will be called a projected photoresist feature. The projected photoresist feature will be roughly the same shape as the masked feature, though corners on projected photoresist features tend to be rounded. Typically a linear dimension in a masked feature is four or five times the size of the corresponding dimension in the projected photoresist feature, depending on the stepper used.

In this description, a photomask feature will refer to a feature in a photomask, which may be a line, a rectangle, or any other shape. This is a broader term than masked feature, in that a photomask feature may not include any blocking material. A photomask feature in a photomask does not transmit sufficient light for the corresponding area on the photoresist surface to be fully exposed, and the wafer surface beneath it will not be exposed after development of the photoresist. The area outside of the projection of the photomask feature is exposed, creating a photoresist feature.

A photoresist feature is a discrete feature formed by exposing and developing photoresist. Such a photoresist feature is surrounded by exposed wafer surface after development of photoresist. This term is broader than the term "projected photoresist feature" because it may be formed by projection, as is the case for a projected photoresist feature, or, as will be seen, by residual photoresist features formed at phase transition boundaries.

Figure 1A:
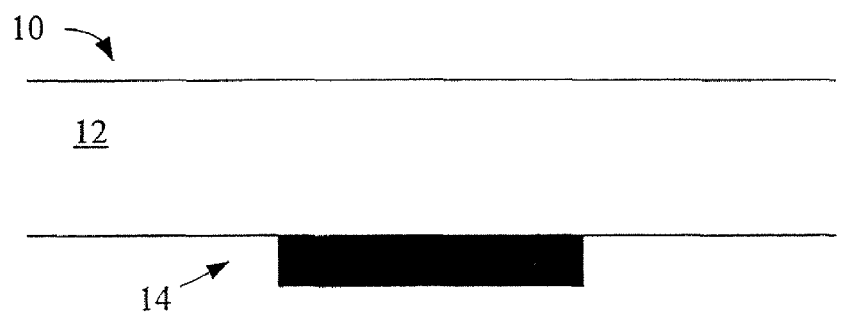
FIG. 1a is a cross section of a portion of a conventional binary photomask.
Figure 1B:
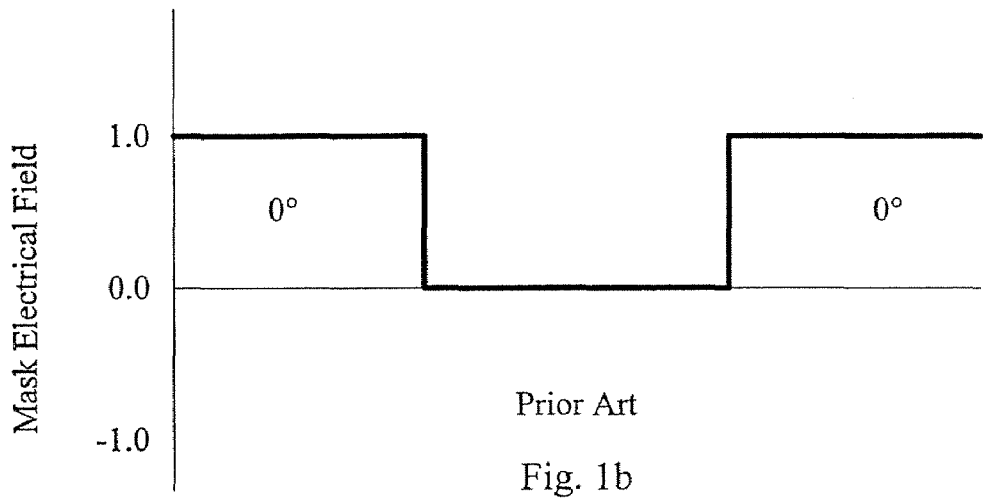

The simplest photomask is a binary photomask 10, shown in FIG. 1a. A plate of a transmitting material 12, for example quartz, makes up the bulk of the photomask. A blocking material 14, typically chromium, is formed in areas where light is to be obscured. FIG. 1b shows the electrical field in the plane of the photomask. The electrical field is either positive (1.0), non-existent (0), or negative (−1.0). Where light is transmitted it is in a first phase, here referred to as zero degree phase. Where light is blocked, there is no electrical field. (In FIGS. 1b and 1c, the X-axis is horizontal position, corresponding with horizontal position across the section of photomask shown in FIG. 1a.)

Figure 1C:
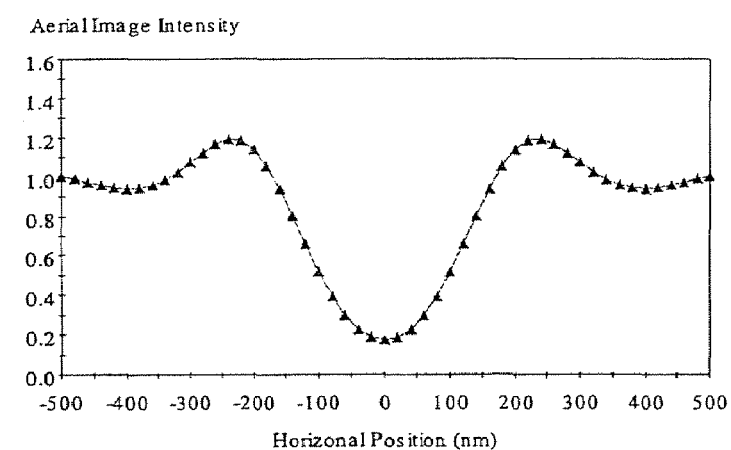

FIG. 1c shows the actual intensity distribution of light at the photoresist surface. It will be seen that, due to interference effects, the edges of lighter and darker areas are not perfectly defined, and even in the center of the obscured area, the light intensity at the photoresist surface is not zero. (A value of zero on the Y-axis of FIG. 1c indicates zero intensity. The value of 1.0 is unitless and arbitrarily assigned, and the other values assigned relative to it. This is a standard representation of image intensity, as will be known to those skilled in the art.)

Figure 2A:
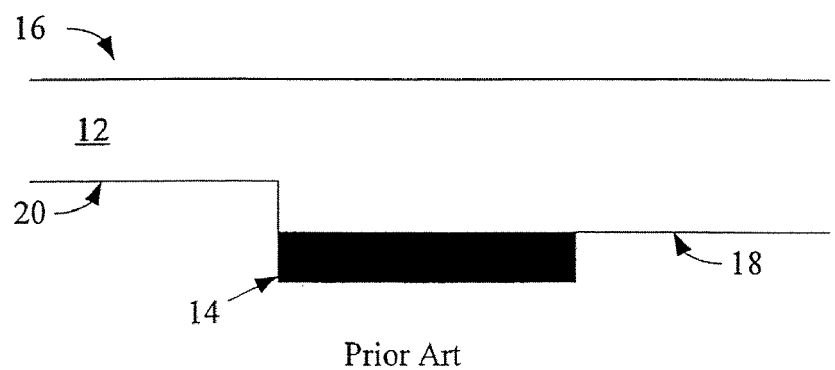
FIG. 2a is a cross section of a portion of a conventional alternating phase shifting photomask.

FIG. 2a illustrates a conventional alternating phase shifting photomask 16. This photomask is also made up of a plate of transmitting material 12, with regions of blocking material 14. In region 18, light is transmitted as in the binary mask. In region 20, however, the transmitting material 12 is etched such that light passing through it is shifted 180 degrees. An area of a photomask which inverts the phase of incident light, such as transmitting area 12, will be called a phase shifter.

Figure 2B:
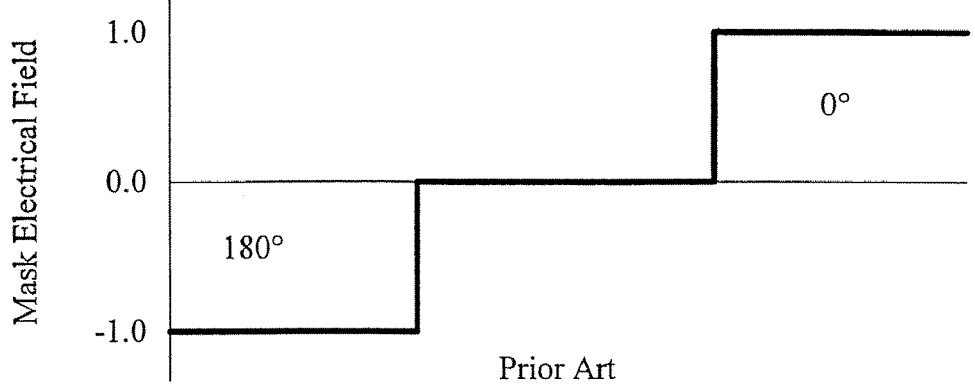

FIG. 2b shows the electrical field in the plane of the photomask: Where light is transmitted with no phase shifting, it is in the first phase, zero degree phase. Where light is blocked, there is no electrical field. Where light is transmitted with phase shifting, it is in 180 degree phase, opposite the first phase. It will be understood that while light in 180 degree phase is perfectly opposite light in zero degree phase, some small deviation can be tolerated; for example light can be in 179 or 183 degree phase rather than 180 degree phase and have substantially the same effect. For purposes of this description, within ten degrees of 180 degrees will be considered to be substantially opposite zero degrees. Similarly, within ten degrees of zero degrees will be considered to be substantially opposite 180 degrees. (In FIGS. 2b and 2c, the X-axis represents horizontal positioning, corresponding with horizontal positioning across the section of photomask shown in FIG. 2a.)

Figure 2C:
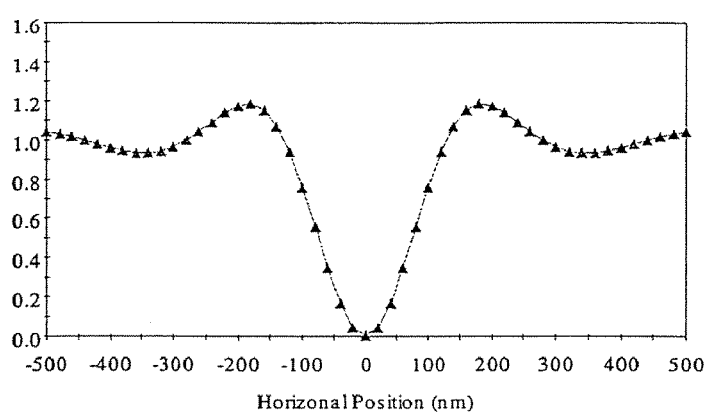

FIG. 2c shows the intensity distribution of light at the photoresist surface. While the electrical field shown in FIGS. 1b and 2b can be either positive or negative, light intensity at the photoresist surface is only zero or positive, since the exposure intensity is proportional to the square of the electric field. The transition from a positive to a negative electrical field in the photomask creates a forced zero of light intensity reaching the photoresist surface, effectively causing dark areas to appear "darker", and making edges sharper.

Figure 3:
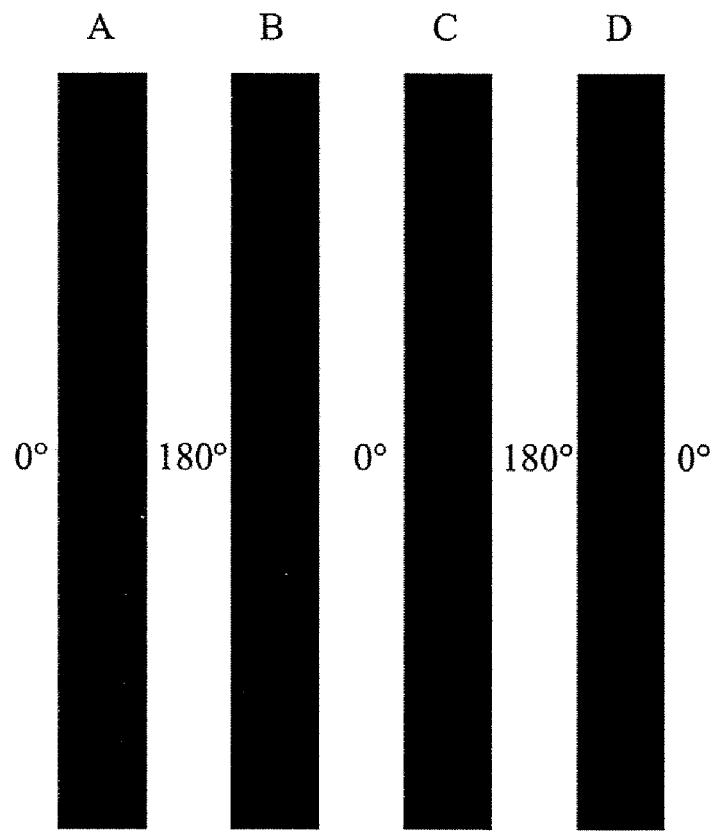
FIG. 3 illustrates phase assignment for a line-and-space pattern using an alternating phase shifting mask.

It will be seen that for a conventional alternating phase shifting mask, opposite phases are used on opposite sides of an obscured region. Phase assignment—the process of determining which phase is to be used in which transmitting area of the photomask—is straightforward for some patterns, such as the alternating line-and-space pattern pictured in FIG. 3. Zero degree phase is assigned to the left of line A, 180 degrees between lines A and B, zero degrees between lines B and C, etc.

Figure 4:
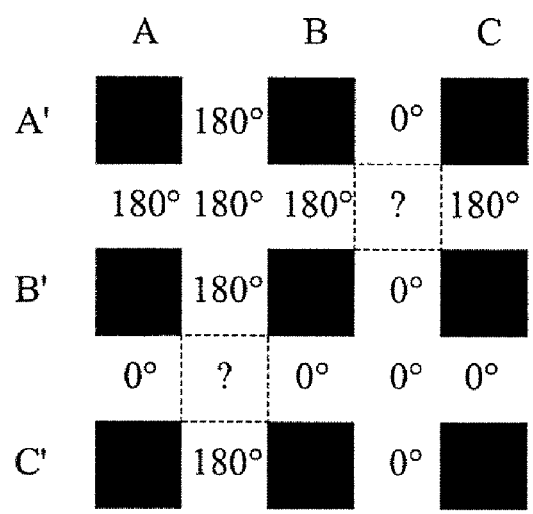
FIG. 4 illustrates phase conflict for rectangular shapes arranged in a grid using an alternating phase shifting mask.

Other patterns present difficulties, however. FIG. 4 shows a photomask including rectangular masked features arranged in a grid pattern. Suppose all areas between rectangles in row A' and in row B' are assigned to 180 degree phase, and all areas between rectangles in row B' and in row C' are assigned to 0 degree phase. Suppose further that all areas between rectangles in column A and in column B are assigned to 180 degree phase, and all areas between rectangles in column B and in column C are assigned to 0 degree phase.

Figure 5:
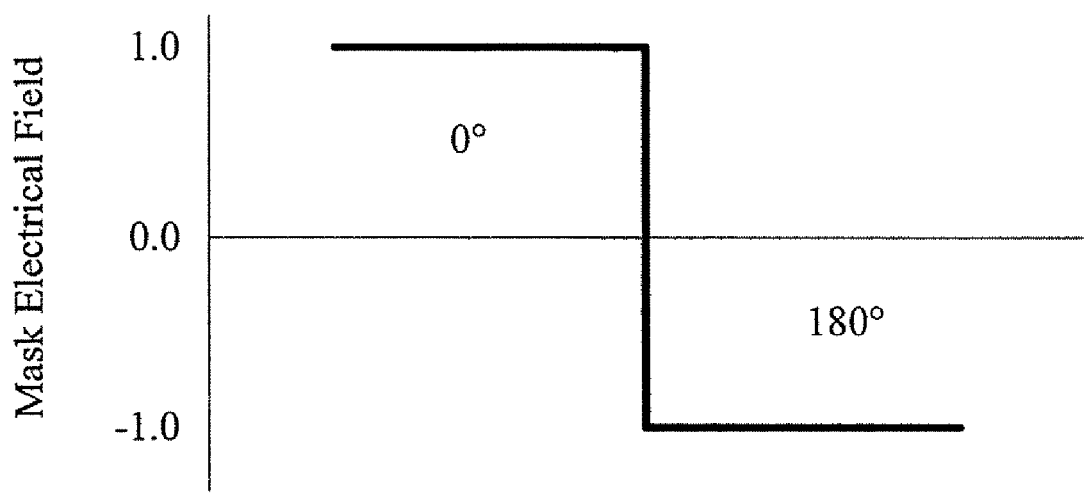
FIG. 5 shows the electrical field in the plane of the photomask when an unshifted region is immediately adjacent a shifted region.

It will be seen that in framed areas marked with a question mark ("?"), either phase could be appropriate, depending on whether the row rule or the column rule is followed. If either phase is assigned, a region of zero degree phase will be immediately adjacent a region of 180 degree phase. In the transition from zero degree phase to 180 degree phase, the electrical field must pass through zero, as shown in FIG. 5. (The X-axis on this figure again corresponds to horizontal position across the photomask.) Where the electrical field is zero, the light intensity at the photoresist surface will be zero, unintentionally creating a region of unexposed photoresist, leading to creation of a residual photoresist feature after development of the photoresist. In this case, the residual photoresist feature is unwanted.

Figure 6:
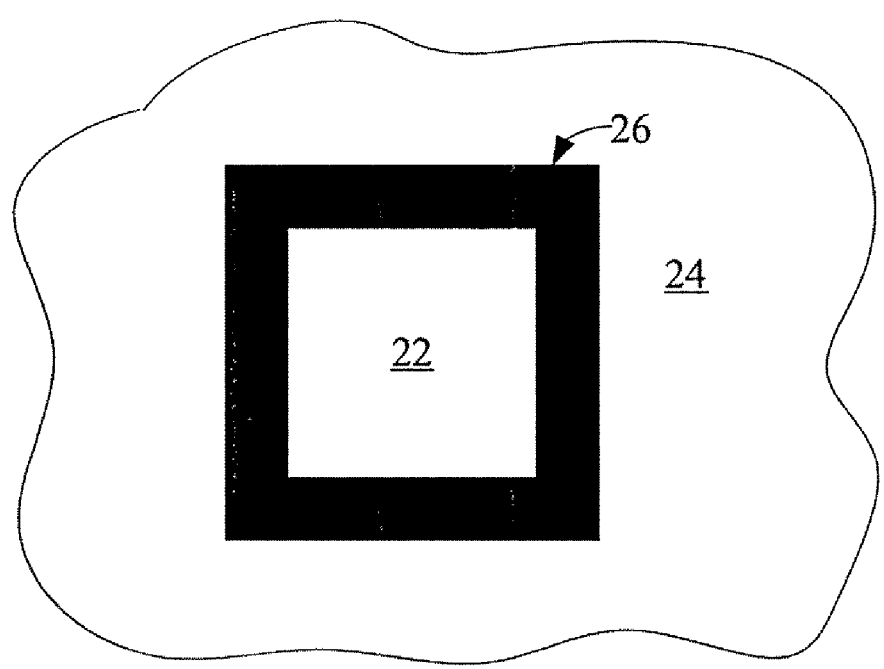
FIG. 6 illustrates a masked feature having an interior nonprinting window surrounded by blocking material.

The '840 patent solved this problem by teaching masked features like the one shown in FIG. 6, each including an interior nonprinting window. For such a feature, light transmitted through transmitted through a transmitting area 24 outside the masked feature is in a second phase opposite the first phase. For example, the window may be a phase shifter, such that light transmitted through the masked feature is in 180 degree phase, while the transmitting area 24 outside window 22 is in zero degree phase. Alternatively, the window 22 may transmit light in zero degree phase, while the transmitting area outside the masked feature 24 is in 180 degree phase. The window is described as "nonprinting" because its dimensions are selected so that it will not print, i.e. such that light transmitted through it will not expose photoresist within the perimeter of the corresponding photoresist feature enough for the wafer surface within the feature to be exposed after development of photoresist. In the '840 patent, the interior nonprinting window 22 was substantially surrounded by blocking material 26. A blocking material is one that transmits 15 percent or less of incident light, for example chromium or molybdenum silicide.

Figure 7:
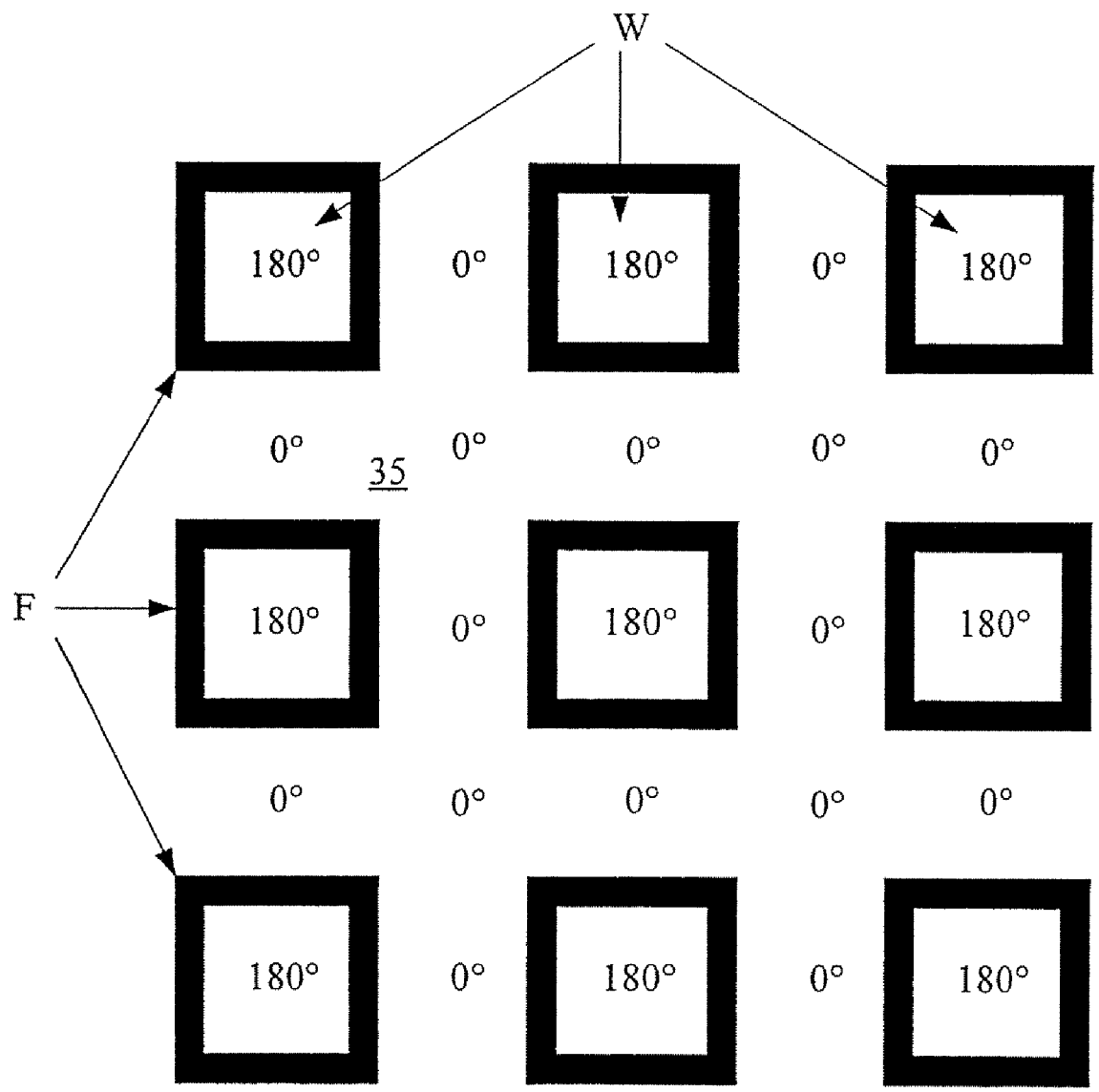
FIG. 7 shows successful phase assignment for rectangular shapes arranged in a grid pattern using nonprinting interior alternating phase shifters.

Turning to FIG. 7, it will be seen that masked features with interior nonprinting windows, as taught in the '840 patent, transmitting light in one phase inside the masked feature and light in an opposite phase outside the masked feature, can be printed with no phase conflict. Each masked feature F of FIG. 7 includes a window W, the window W comprising a phase shifter. Thus the windows W are assigned 180 degree phase. The transmitting area 35 commonly and substantially entirely surrounding the masked features F is assigned zero degree phase. Clearly the phases could be inverted if desired.

The techniques of the '840 patent provide a powerful tool to pattern very fine features. The photomask used in the '840 patent, however, is relatively complex and expensive to make. The present invention uses similar concepts, but omits the surrounding blocking material (blocking material 26, shown in FIG. 6) used in the '840 patent, resulting in a photomask which is simpler and cheaper to make.

It has been described that when a nonshifting area and a shifting area in a photomask are immediately adjacent, at the transition from zero degree phase to 180 degree phase, the electrical field must pass through zero, as shown in FIG. 5. The light intensity at the corresponding point on the photoresist surface is also zero, so a residual photoresist feature remains on the wafer surface after the photoresist is developed.

Figure 8:
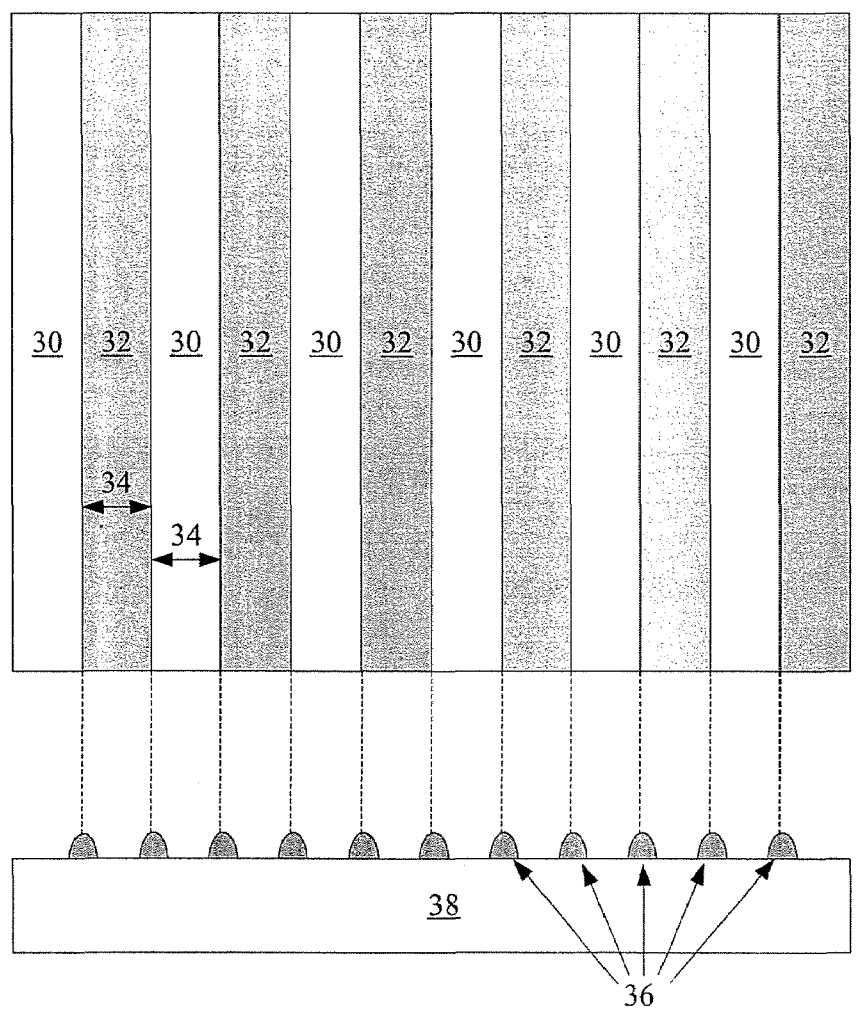
FIG. 8 shows a prior art phase shifting mask and the residual photoresist features created by it.

Prior art chromeless phase edge techniques have made use of this residual photoresist feature. Turning to FIG. 8, a photomask is shown consisting of parallel lines, where the lines are alternately shifting regions 30 and nonshifting regions 32, each having a width 34. Such an arrangement is described in prior art which is mentioned in Lee et al., U.S. Pat. No. 5,240,796. Each of the shifting and nonshifting regions is printing, exposing a corresponding area on the photoresist surface. FIG. 8 further shows, below the photomask in cross-section, the wafer and photoresist surface after developing. It will be seen that residual photoresist lines 36 form on the wafer surface 38 at the phase transition boundaries, creating patterned lines after etch. (Dotted lines relate the phase transition in the photomask with the resulting residual photoresist feature.)

Figure 9:
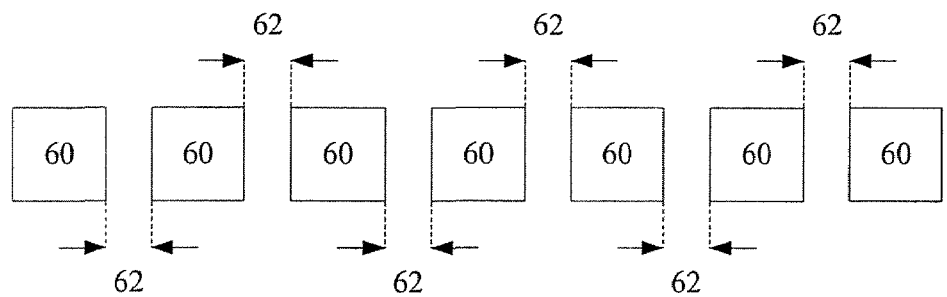
FIG. 9 illustrates adjacent shifting areas separated by very thin, nonprinting transmitting areas according to a prior art photomask.

In other prior art, for example Chen et. al., U.S. Pat. No. 6,482,555 (hereinafter the '555 patent), several phase shifting windows are placed in close proximity to each other, with no blocking material used, as in FIG. 5b or FIG. 7 of the patent, and as shown in FIG. 9 of the present application. Turning to FIG. 9, of the present application, the transmitting area between the phase shifting areas 60 of the '555 patent has width 62. This width 62 is so small that the residual photoresist features created by adjacent shifting areas 60 merge, forming a single, large photoresist feature. Thus the transmitting area between phase shifters is nonprinting.

The present invention is a photomask comprising nonprinting transmitting windows transmitting light in a first phase entirely surrounded by a printing transmitting area transmitting light in a second phase opposite the first phase, with no blocking material intervening. The transition between the phases causes a closed residual photoresist feature to be formed at the perimeter of such a nonprinting transmitting window. The dimensions of the nonprinting transmitting window are chosen such that opposite sides of the residual photoresist feature merge, so that, during normal use of the photomask, photoresist in the interior of the feature is not exposed sufficiently to expose the wafer surface after the photoresist is developed. A patterned feature can be created from each residual photoresist feature.

Figure 10A:
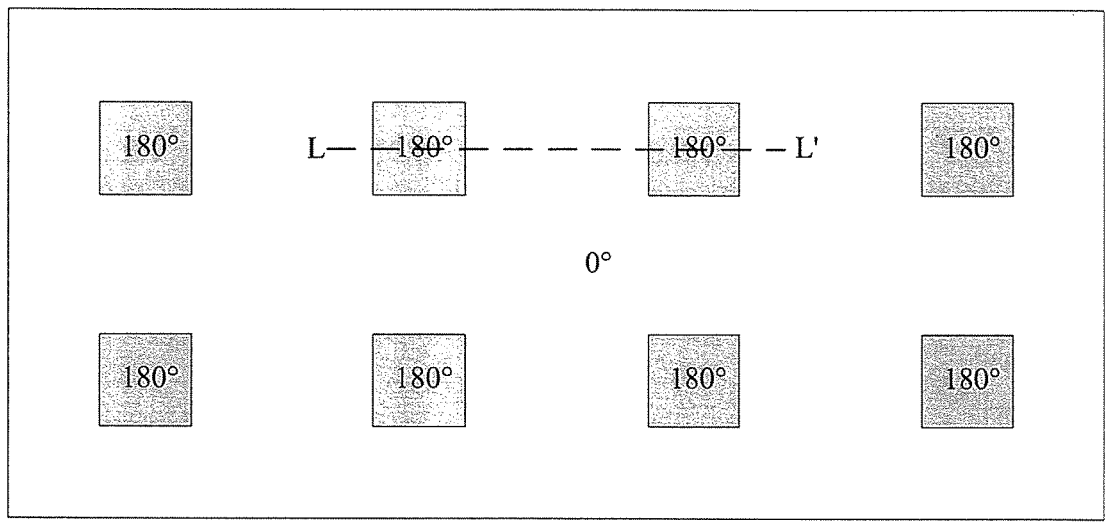
FIG. 10a shows a photomask according to the present invention in plan view.

To contrast with other photomasks mentioned herein: In the present invention, a photomask comprises shifting areas immediately adjacent to nonshifting areas, with no blocking material intervening (unlike the '840 patent). In aspects of the present invention, either the shifting area or the nonshifting area is nonprinting, so that opposite sides of a single closed residual photoresist feature formed by the nonprinting area merge (unlike the alternating shifting and non-shifting stripe photomask described in Lee et al.). The nonprinting area is entirely surrounded by an area that is printing (unlike the '555 patent) and creates a photoresist feature that does not merge with an adjacent photoresist feature. FIG. 10a, for example, shows a plan view of a section of a photomask formed according to the present invention. The areas labeled 180° are shifting, while the area labeled 0° is nonshifting. Clearly, the phases could be inverted if desired.

To summarize, an examplary photomask according to the present invention comprises a transmitting nonprinting window transmitting light in a first phase; and a transmitting area substantially entirely surrounding and in contact with the transmitting window on all sides with no blocking material intervening, wherein the transmitting area transmits light in a second phase, the second phase substantially opposite the first phase, and wherein, when used to pattern photoresist, the transmitting area is printing on all sides of the transmitting window. A transmitting window is a continuous area of a photomask which transmits light and includes no blocking material which is surrounded on all sides by some other material.

Figure 10B:
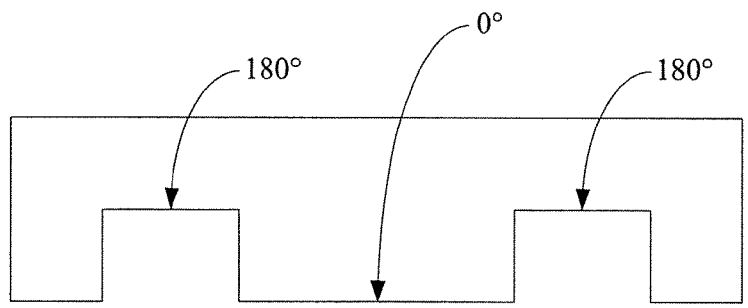
FIG. 10b shows a photomask according to the present invention in cross section.

FIG. 10b shows the same section of photomask in cross section, the cross section taken along line L-L' of FIG. 10a. Shifting areas have been thinned to shift incident light by about 180 degrees, while nonshifting areas do not shift incident light. No blocking material separates shifting areas from nonshifting areas.

Figure 10C:
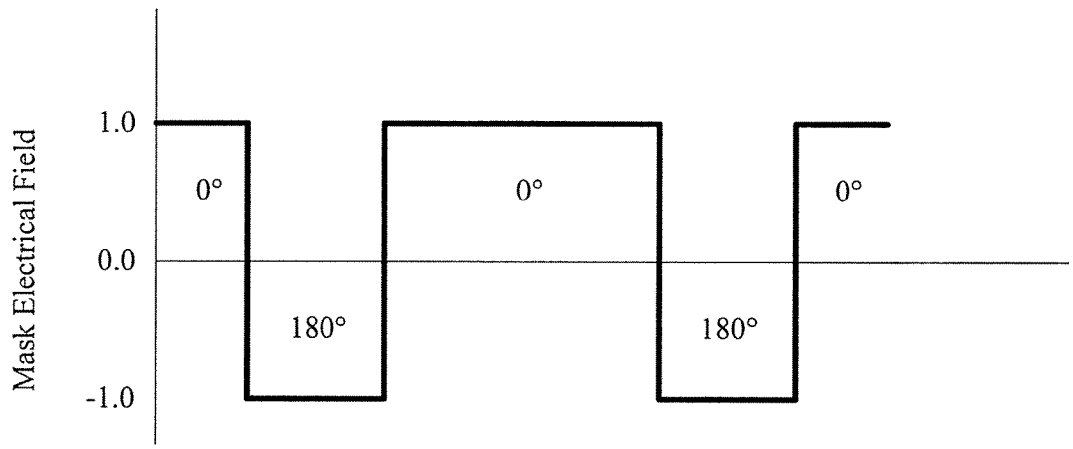
Figure 10D:
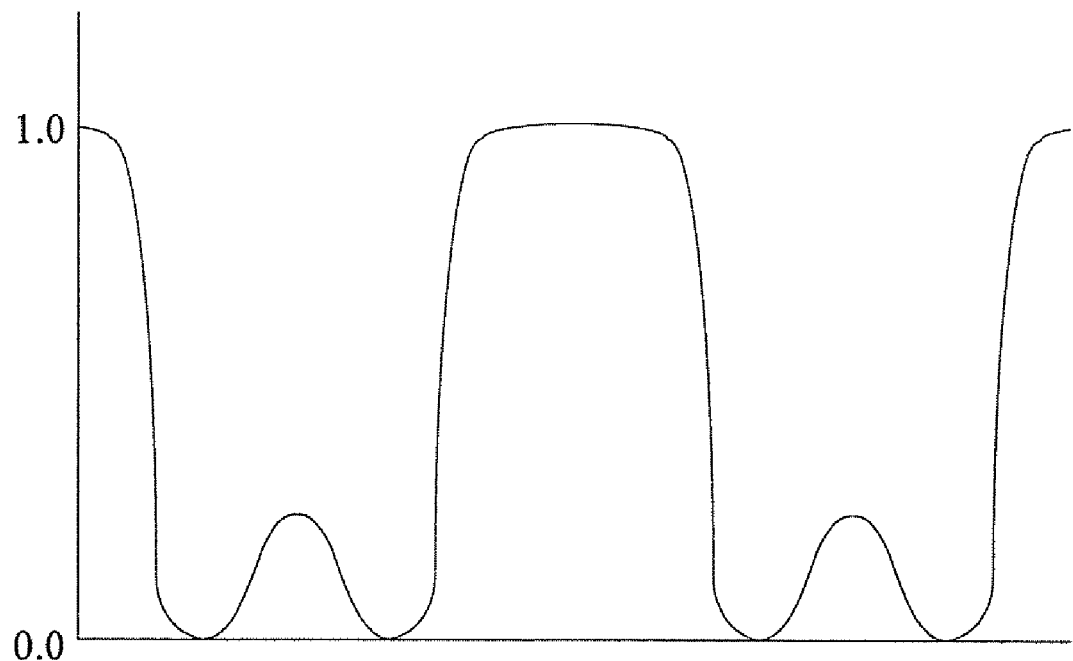
Figure 10E:
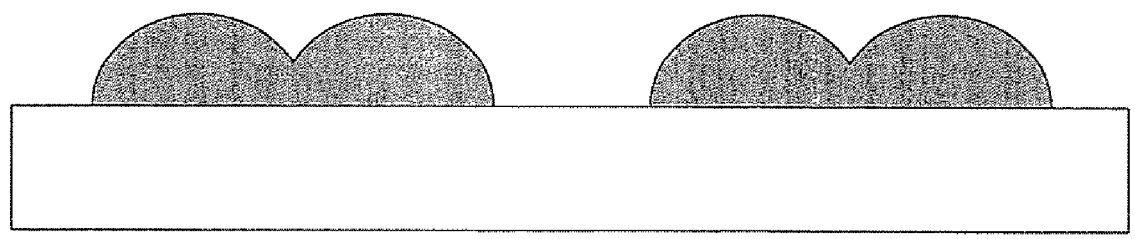

In relation to the photomask of FIG. 10a, FIG. 10c shows the electric field in the plane of the photomask, and FIG. 10d shows the light intensity at the photoresist surface. FIG. 10e illustrates (in cross-section) residual photoresist features formed on the wafer surface after developing the photoresist. It will be seen that, if the dimensions of the shifting area and the nonshifting areas are chosen appropriately, the opposite sides of a single residual photoresist features formed at the phase transition perimeter are so close together that they are in contact, and merge.

Thus, using such a photomask, a patterned feature can be formed by transmitting light through a phase shifting photomask onto photoresist covering the wafer surface; forming an isolated first residual photoresist feature between a first wafer area exposed to light in a first phase and a second wafer area exposed to light in a second phase, wherein the first phase is substantially opposite the second phase, and wherein the second wafer area entirely surrounds the first wafer area in the plane of the wafer; and forming the patterned feature from the photoresist feature. In this case the isolated first photoresist feature defines a closed shape having a perimeter, and, after the developing step and before the etching step, no portion of the wafer surface is exposed within the perimeter. The photoresist feature is described as isolated because it is not merged with an adjacent photoresist feature.

Such a photomask is relatively simple to make, compared to the photomask used in the '840 patent.

Figure 11A:
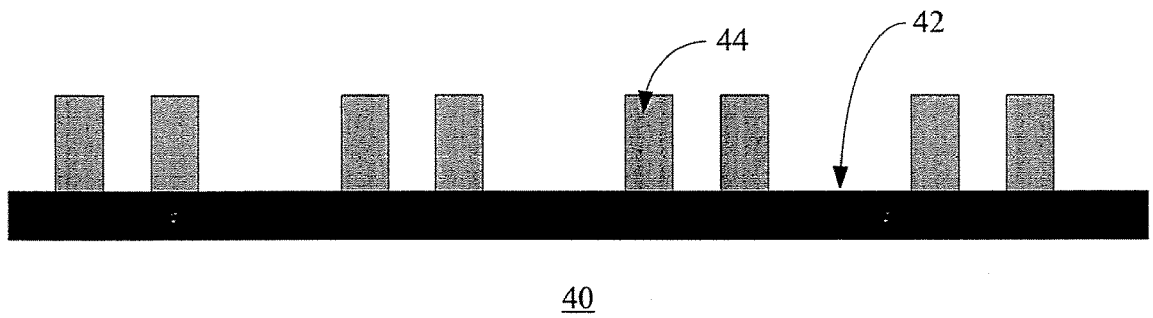
FIGS. 11a through 11d illustrate formation of a photomask having masked features with interior nonprinting windows.
Figure 11B:
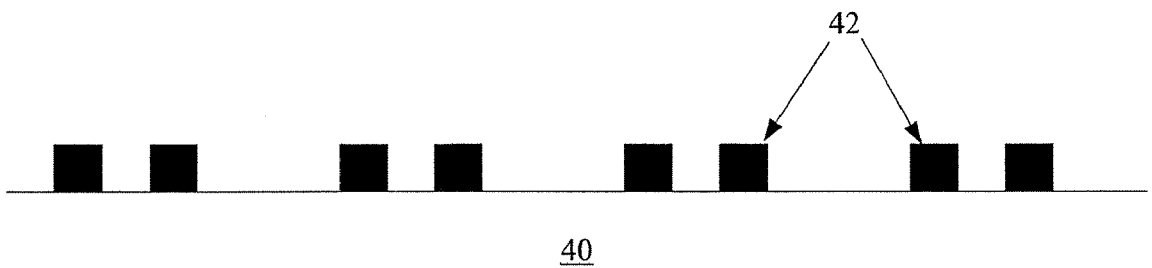

The photomask of the '840 patent requires two patterning steps, one to pattern the blocking material, the second to etch the quartz to form the shifting area. Turning to FIG. 11a, patterning begins with quartz layer 40 coated with a layer of blocking material (typically chromium) 42. Photoresist 44 is deposited on chromium layer 42, then patterned in the shape of the blocking material defining masked features with interior nonprinting windows, like the photomask shown in FIG. 7. FIG. 11b shows the photomask after etch of chromium layer 42 and removal of photoresist. (It will be noted that in cross-sectional figures representing patterning of a photomask, the photomask appears upside down relative to its presentation in figures representing the photomask in use; in FIG. 2a, for example, where the blocking material appears below the photomask, as opposed to FIG. 11a, where it is shown above. This represents the orientation of the photomask during these respective activities.)

Figure 11C:
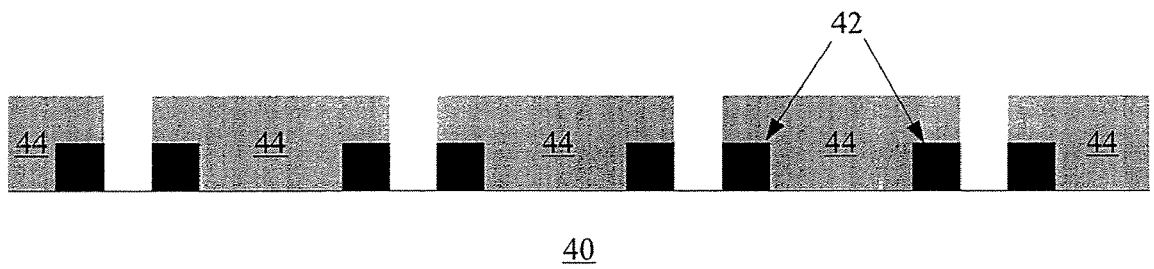
Figure 11D:
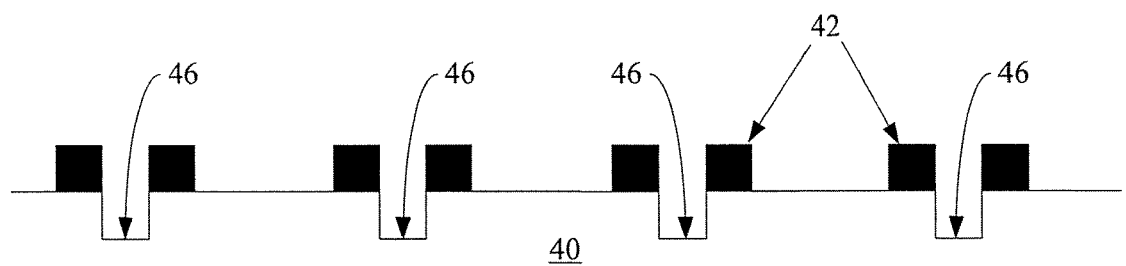

For the second patterning step, photoresist is again applied and patterned, this time exposing only the interior windows of the masked features, as shown in FIG. 11c. An etch step thins quartz layer 40, creating shifting areas 46, as shown in FIG. 11d, which shows the completed photomask.

Both photolithography steps performed to create the photomask of the '840 patent present challenges; the first includes patterning of complex shapes, while the second requires precise alignment.

Figure 12A:
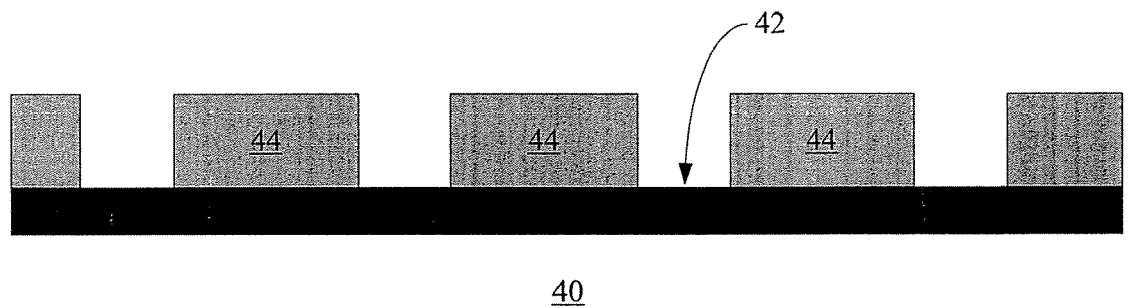
Figure 12B:
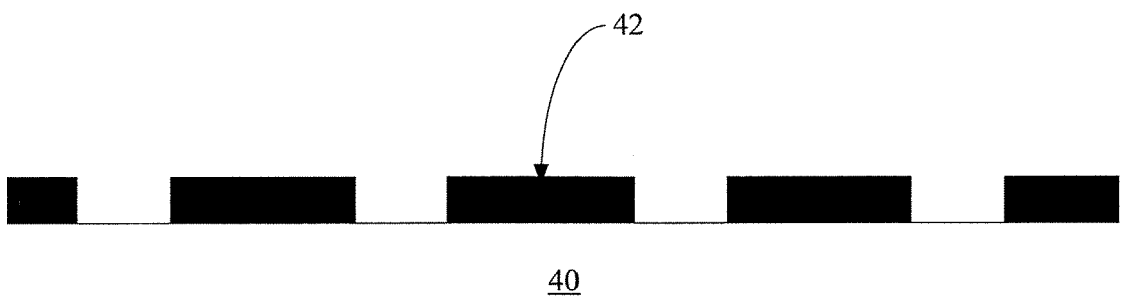

Forming the photomask according in the present invention, for example the photomask shown in FIG. 10a, is significantly simpler. Turning to FIG. 12a, patterning again begins with quartz layer 40 coated with chromium layer 42. Photoresist 44 is deposited on chromium layer 42, then patterned to excavate rectangular holes in the photoresist. FIG. 12b shows patterned chromium remaining after the etch step. In this example, a continuous area of chromium remains with rectangular holes etched in the chromium, the surface of quartz layer 40 exposed in the holes. A second etch step follows, in which the remaining chromium 42 serves as a hard mask while the quartz layer 40 is etched to produce rectangular shifting areas 46 shown in FIG. 12c. FIG. 12d shows the completed photomask after the chromium layer 42 has been stripped.

Only a single, relatively simple patterning step is required to make this photomask. It will be noted that none of chromium layer 42 remained in the completed photomask shown in FIG. 12d. It was included in this description because standard photomask blanks as purchased normally include this layer. If quartz or some other suitable photomask substrate with no chromium layer was used as the starting point, then photoresist could be deposited directly on the quartz, the photoresist patterned and the quartz etched, without the intermediate chromium etch.

For clarity, an example has been provided of how to make a photomask according to the present invention. Many variations will be readily apparent to those skilled in the art. This example described a photomask having shifting transmitting areas surrounded by a nonshifting transmitting area; clearly the phases could be inverted. Negative photoresist is also well known in the art. When developed, the exposed areas of negative photoresist remain, while the obscured areas are removed. For brevity, the present application describes the use of positive photoresist. Those skilled in the art will appreciate that negative photoresist could be used either in formation of the photomask or when patterning the wafer surface. A regular rectangular pattern was described; clearly other patterns can be envisioned.

When describing dimensions in a photomask, it is usual to speak of those dimensions in terms of projected dimensions; i.e. rather than describing the actual size of a photomask feature in the photomask, one describes the size of the photomask feature multiplied by the stepper magnification. Stepper magnification is typically 4 or 5; i.e. a linear dimension of a chromium area in a photomask is typically about four or five times larger than the size of the same feature as projected onto the photoresist surface.

This description will follow this convention. A photomask feature dimension will be described as "×S", or multiplied by a projection scaling factor S. The projection scaling factor S is the stepper magnification. Suppose, for example, the stepper magnification, and hence the projection scaling factor, is four. If the actual physical dimension of a photomask feature in a photomask is, for example, 1000 nm, the dimension of the photomask feature will be described as 250 nm×S. For a stepper magnification and projection scaling factor S of five, an actual physical dimension of 1000 nm of a photomask feature will be described as 200 nm×S.

Stepper magnification is determined by optics, and it is the single most important factor controlling the relationship between the size of a photomask feature and the size of the resulting projected photoresist feature. It is not, however, the only factor. As is well known in the art, varying the exposure dose also changes the size of projected photoresist features. A longer exposure results in more light energy reaching the photoresist surface, and more thorough exposure of photoresist. When the photoresist is developed, more photoresist is removed; thus for a larger exposure dose, the dimensions of the eventually etched features are smaller. FIG. 13a and FIG. 13b, for example, show projected photoresist features 47 after development. The photoresist feature 47 of FIGS. 13a and 13b could be formed from the same photomask feature in the same photomask during separate photolithography operations. The narrower photoresist feature 47 of FIG. 13b is created when a higher exposure dose is applied.

It will be recalled that in aspects of the present invention, residual photoresist features are formed using a photomask fabricated according to the present invention, having first transmitting windows transmitting light in a first phase surrounded by a second transmitting area transmitting light in a second phase, the second phase substantially opposite the first phase. The sizes of the first transmitting windows are selected such that the opposite sides of a single residual photoresist feature formed at the perimeter of a window merge. The residual photoresist feature forms at the transition between opposite phases; i.e., at the border between the projection of a first transmitting window and the second transmitting area surrounding it, and not entirely within the boundaries of the first transmitting window. Thus a linear dimension of a photoresist feature defined by merged residual photoresist lines may be larger than the linear dimension×S of the photomask feature used to create it.

Many interrelated factors determine the actual dimension that a transmitting window must have in its shortest dimension to be nonprinting, according to the present invention. In general, the size of the window is proportional to the wavelength of incident light, and is inversely proportional to numerical aperture.

Figure 14A:
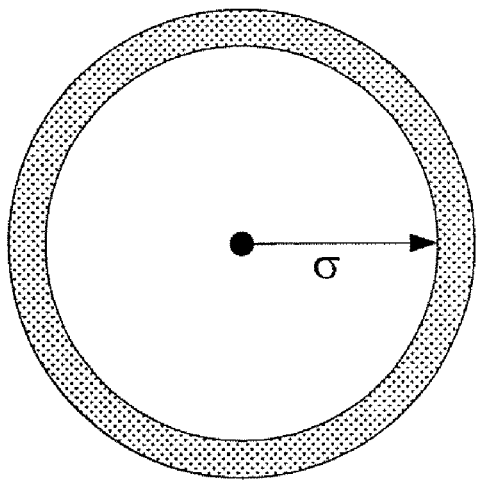
FIGS. 14a-14d show different illumination apertures.
Figure 14B:
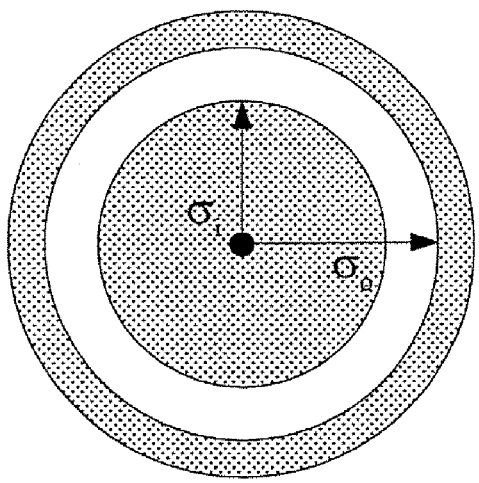

The shortest dimension for a transmitting window to be nonprinting is also affected by the aperture of the condensing lens. This value can either be a single aperture radius σ, or can be an inner aperture radius $\sigma_i$ and an outer aperture radius $\sigma_o$. FIG. 14a shows a conventional aperture which has a single aperture radius σ. An annular aperture is shown in FIG. 14b, in which the center area is obscured and light is transmitted through an annulus having an outer aperture radius $\sigma_o$ and an inner aperture radius $\sigma_i$.

Figure 14C:
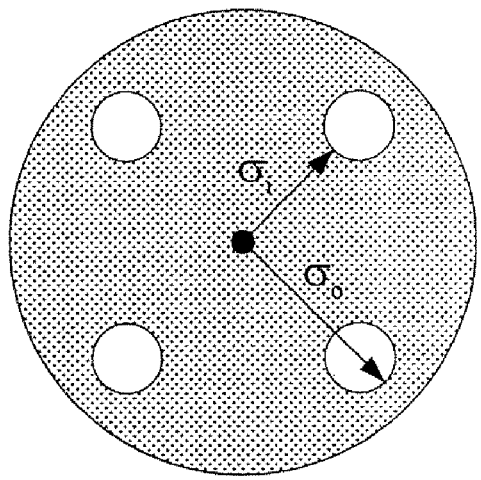
Figure 14D:
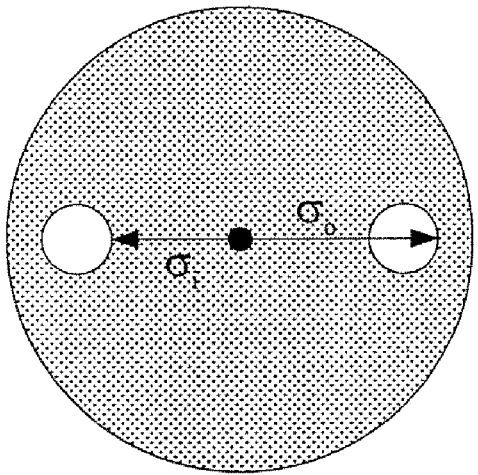

A quadruple aperture, shown in FIG. 14c, is obscured except for four holes arranged as shown. The outer aperture radius $\sigma_o$ is the distance to the outside edge of each hole, while the inner aperture radius $\sigma_i$ is the distance to the inside edge of each hole. A dipole aperture, shown in FIG. 14d, is obscured except for two holes arranged as shown. The outer aperture radius $\sigma_o$ is the distance to the outside edge of each hole, while the inner aperture radius $\sigma_i$ is the distance to the inside edge of each hole. Aperture radius is generally unitless, and is expressed as a proportion of the entire lens. For example, for a conventional aperture, σ is typically about 0.7.

The relationship of all of these factors can be summarized as follows:

$$D \infty \frac{\lambda}{\left(1 + \frac{\sigma_i + \sigma_o}{2}\right)NA}$$

In this equation, D represents the size the shortest dimension of a transmitting window must have in order to be nonprinting; λ is the wavelength of incident light, $\sigma_i$ is the inner aperture radius and $\sigma_o$ is the outer aperture radius; and NA is the numerical aperture. Thus D is proportional to wavelength λ, and is inversely proportional to aperture radius σ (or inner aperture radius $\sigma_i$ and outer aperture radius $\sigma_o$) and numerical aperture NA.

Conventionally, light of two wavelengths are in general use: 248 nm (KrF) and 193 nm (ArF).

In general, for 248 nm photolithography, at any point at which a transmitting window has a dimension no more than about 160 nm×S, it will be nonprinting. Similarly, for 193 nm photolithography, at any point at which a transmitting window has a dimension no more than about 120 nm×S, it will be nonprinting.

In practical terms a window having a shortest dimension smaller than about 50 nm will be ineffective; preferably the window of the present invention should have no dimension less than about 60 nm.

Figure 15:
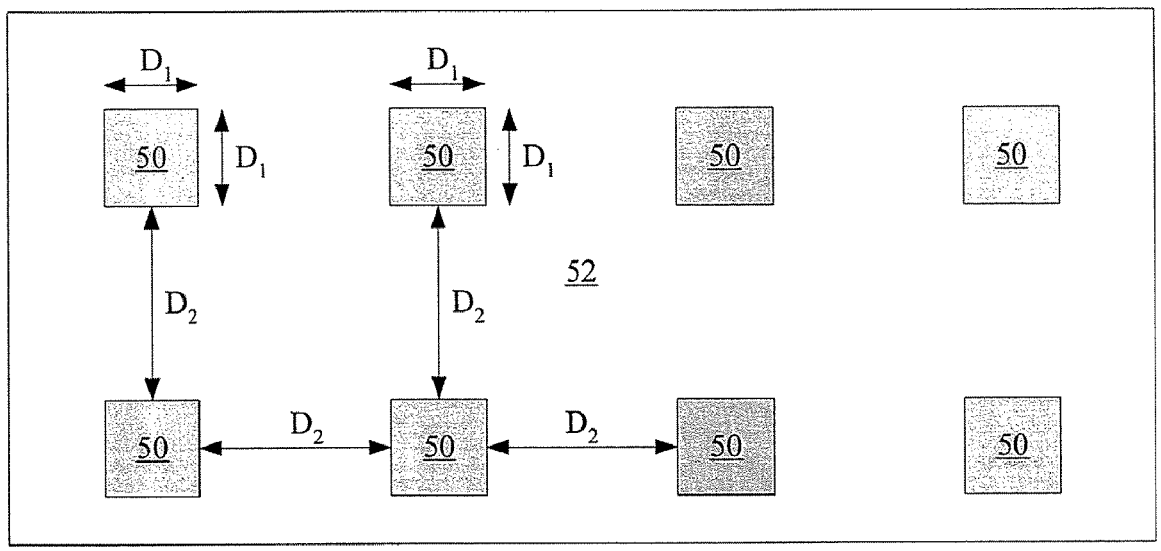
FIG. 15 shows a photomask according to the present invention in plan view.

FIG. 15 is a plan view of an exemplary photomask formed according to the present invention. The photomask comprises a plurality of transmitting nonprinting windows 50 transmitting light in a first phase; a transmitting area 52 transmitting light in a second phase, each transmitting window 50 substantially entirely surrounded by and in contact with the transmitting area 52 with no blocking material intervening, wherein the second phase is substantially opposite the first phase, and wherein a first width of unbroken transmitting area 52 surrounds each transmitting window on all sides, the first width sufficient for the unbroken transmitting area 52 to print when the photomask is used to expose photoresist.

In this example, windows 50 have linear dimension $D_1$, and are separated by distance $D_2$. $D_1$ is chosen so that opposite sides of a single residual photoresist feature formed on the photoresist surface at the projected perimeter of a window merge, and the window 50 is nonprinting. $D_2$ is chosen so that the space between the windows prints, that is, so that the photoresist in this area is exposed sufficiently that it is removed during developing. Because the window 50 is a closed feature, its interior receives less overall light than does the transmitting area 52 between windows. For this reason dimension $D_1$ can be larger than first dimension $D_2$ while window 50 is nonprinting and transmitting area 52 is printing. The exposure dose must be selected so that the windows 50 are nonprinting. (This example shows windows 50 square and uniformly spaced. Clearly many other arrangements are possible. Transmitting windows 50 can be rectangular but not square, or any other shape. Transmitting windows 50 can be randomly spaced.)

Figure 16A:
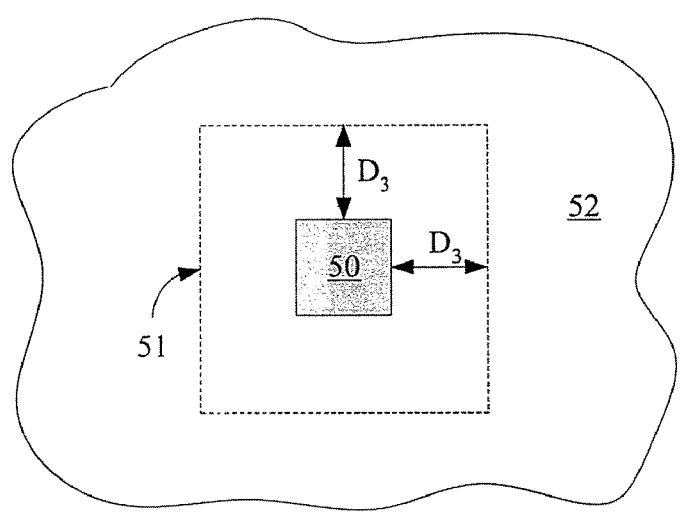
FIG. 16a shows, in plan view, a transmitting window surrounded by a first width of unbroken transmitting area according to the present invention.

Describing the transmitting area surrounding a transmitting window on all sides as "unbroken" for a first width means that within that width only the transmitting area exists, and that no other material, such as blocking material or another transmitting window transmitting light in a different phase, is present. For example, turning to FIG. 16*a*, transmitting window 50, which transmits light in a first phase, is surrounded on all sides by a first width D3 of unbroken transmitting area 52, which transmits light in a second phase substantially opposite the first phase. The boundary of first width D3 is denoted by the dotted-line frame 51. No other material exists within first width D3 of transmitting window 50. The first width D3 is sufficient for the unbroken transmitting area 52 to print when the photomask is used to expose photoresist; in preferred embodiments, the first width D3 is at least 100 nm×S. As is visible from a comparision of FIGS. 15 and 16*a*, $D_3$ may equal $D_2$, and vice-versa, in a regular pattern such as in FIG. 15.

Figure 16B:
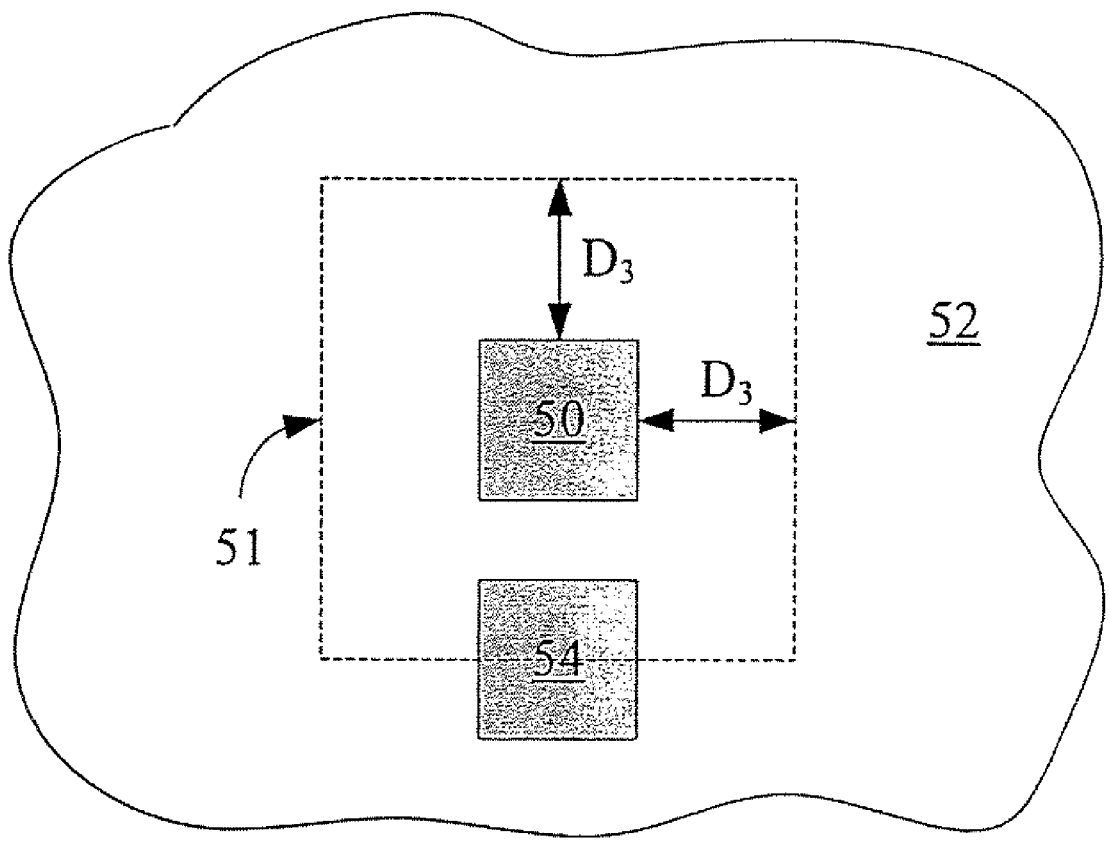
FIG. 16b shows, in plan view, a transmitting window not surrounded by a first width of unbroken transmitting area.

In contrast, in FIG. 16*b*, transmitting window 54, which in this example transmits light in the first phase, is less than a first width $D_3$ from transmitting window 50, and thus transmitting window 50 in FIG. 16*b* is not surrounded on all sides by first width $D_3$ of unbroken transmitting area 52. An example of such a configuration appears in the '555 patent, in which the width of the transmitting area separating adjacent transmitting shifting windows is not sufficient for the transmitting area between those windows to print when the photomask is used to expose photoresist.

In other words, FIG. 15 shows a section of a photomask. The photomask comprises a plurality of spatially separate transmitting nonprinting windows 50 transmitting light in a first phase; a transmitting area 52 transmitting light in a second phase, the second phase substantially opposite the first, the transmitting area 52 entirely surrounding and in contact with each of the transmitting windows 50 of the first plurality; wherein each transmitting window is separated from its nearest neighbor in the plurality by an unbroken length of transmitting area having at least a first dimension $D_2$, and wherein the smallest dimension $D_1$ of each window is no more than about 160 percent of the first dimension $D_2$. As described earlier, because the window 50 is a closed feature, its interior receives less overall light than does the transmitting area 52 between windows. For this reason dimension $D_1$ can be larger than first dimension $D_2$ while window 50 is nonprinting and transmitting area 52 is printing. It will be evident that the smallest dimension DI of each window is measured in a plane parallel to the plane of the photomask.

Monolithic three dimensional memory arrays such as the one taught in Herner et al., U.S. patent application Ser. No. 10/326470, "An Improved Method for Making High Density Nonvolatile Memory," filed Dec. 19, 2002, now abandoned, and hereby incorporated by reference, include a plurality of substantially evenly spaced pillars. These pillars can comprise polycrystalline silicon, called polysilicon. The pillars are portions of memory cells, and the memory cells formed in the same patterning steps generally form a portion of a memory level at a first height above a substrate. Such a monolithic three dimensional memory array further comprises at least a second memory level formed at a second height above the substrate, the second height different from the first height.

The substantially evenly spaced pillars of Herner et al. have a pitch of between about 220 nm and 280 nm, preferably about 260 nm, and are patterned, for example, using light having a wavelength of 248 nm. A photomask according to the present invention paired with a quadruple aperture is highly effective for patterning regularly spaced pillars.

It will be recalled that light is projected through a photomask having a photomask feature to create a corresponding photoresist feature. The photoresist feature is then processed, typically by etching, to create a patterned feature. Pillars, for example the pillars of Herner et al., are the patterned features created from the photomask features 50 of FIG. 15.

The photomask of FIG. 15 can advantageously be used to pattern the pillars of Herner et al. When used for this purpose, referring to FIG. 15, photomask feature dimension D1 is between about 50 nm×S and about 160 nm×S, preferably between about 90 nm×S and about 140 nm×S, most preferably between about 130 and 140 nm×S. The shortest dimension of the transmitting window 50 is no more than about 160 nm×S. Photomask feature dimension D2, then, is between about 210 nm×S and about 100 nm×S, preferably between about 170 nm×S and about 120 nm×S, most preferably between about 130 nm×S and 120 nm×S. With a proper exposure dose, these photomask dimensions should produce photoresist features having a width of about 130 nm and separated by a gap of about 130 nm. Dose selection varies from design to design, photomask to photomask, and machine to machine, and it is routine for some experimentation to be required to identify an optimum dose. Preferably the width of the photoresist features is no more than about 150 nm, and the gap is no less than about 110 nm. The photoresist features are then etched to form the patterned features, which will be pillars, as described in Herner et al. As noted in Herner et al., while the masked feature is rectangular, the cross-section of the patterned feature will tend to be substantially cylindrical. The dimensions given here assume that the light has a wavelength of 248 nm.

It will also be understood by those skilled in the art that, depending on the materials etched and the etch processes used, photoresist feature dimensions may not be the same as actual patterned feature dimensions. It is routine to adjust the exposure dose and etch processes to achieve optimum results.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Lee et al., U.S. Pat. No. 6,881,994, "Dense Arrays and Charge Storage Devices, and Methods for Making Same," filed Aug. 13, 2001, and issued Apr. 19, 2005; Herner, U.S. Pat. No. 6,853,049 "Silicide-Silicon Oxide-Semiconductor Antifuse Device and Method of Making," filed Mar. 13, 2002, and issued Feb. 8, 2005; Vyvoda et al., U.S. Pat. No. 6,952,043, "Electrically Isolated Pillars in Active Devices," filed Jun. 27, 2002, and issued Oct. 4, 2005; Walker et al., U.S. Pat. No. 7,005,350, "Method for Fabricating Programmable Memory Array Structures Incorporating Series-Connected Transistor Strings," filed Dec. 31, 2002, and issued Feb. 28, 2006; Scheuerlein et al., U.S. application Ser. No. 10/335,078, "Programmable Memory Array Structure Incorporating Series-Connected Transistor Strings and Methods for Fabrication and Operation of Same," filed Dec. 31, 2002; Vyvoda, U.S. patent application Ser. No. 10/440,882, "Rail Schottky Device and Method of Making", filed May 19, 2003; and Cleeves et al., "Optimization of Critical Dimensions and Pitch of Patterned Features in and Above a Substrate," U.S. patent application Ser. No. 10/728,437, filed Dec. 5, 2003, all assigned to the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

These monolithic three dimensional memory arrays are highly dense structures. Thus photomasks made according to the present invention can advantageously be used to pattern any of the lines, pillars, or other tightly-packed structures formed at any level of these arrays.

It will be evident, however, that the techniques described herein are in no way limited to three dimensional memory arrays, and can be used to pattern any fine features, including conventional two-dimensional and non-memory devices.

The examples provided in this description of photomasks formed according to the present invention have largely depicted regular patterns, for example evenly spaced rectangles of uniform size. Regular patterns offer the advantage that it is simpler to determine exactly what size photomask feature and exposure dose are required to create a patterned feature of a desired size; once the determination is made, it applies to all of the elements in the pattern. Nonetheless, the methods and photomasks of the present invention can be applied to features of any shape, and the patterned features need not be uniformly sized or spaced.

An area of a photomask can be described as having a shifting degree. A shifting degree describes the shifting characteristics of a transmitting area of a photomask. If light transmitted through an area of a photomask is not phase shifted, for example, that area has a shifting degree of about zero degrees. If light transmitted through an area of a photomask is phase shifted to the opposite phase, that area has a shifting degree of about 180 degrees.

To summarize, FIG. 15 shows a phase shifting photomask comprising a transmitting nonprinting window 50 having a first shifting degree; a second transmitting area 52 having a second shifting degree, the second transmitting area 52 entirely surrounding and in contact with the first transmitting window 50, wherein the second transmitting area 52 is printing on all sides of the transmitting window 50; and wherein the second shifting degree is substantially opposite the first shifting degree.

Photomasks formed according to the present invention have been described which include first transmitting windows transmitting light in a first phase surrounded by a second transmitting area transmitting light in a second phase, the second phase substantially opposite the first phase. In the examples provided, no blocking material separated the first transmitting windows from the second transmitting area. It should be noted, however, that photomask features with no blocking material formed according to the present invention can be combined in a single photomask with conventional photomask features that include blocking material. More specifically, the presence of blocking material in any part of a photomask does not preclude it from falling within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A method for patterning pillars, the method comprising:
   a) projecting light onto photoresist using a photomask, the photoresist being a positive resist, the photomask comprising:
      a plurality of transmitting nonprinting windows transmitting light in a first phase and having a shortest linear dimension $D_1$ parallel to the photomask surface between about 50 nm×S and about 160 nm×S where S is a projection scaling factor;
      a transmitting area transmitting light in a second phase, each of the plurality of transmitting nonprinting windows being substantially entirely surrounded by and in contact with the transmitting area along a perimeter, but without intervening blocking material;
      wherein a plurality of borders is formed where light in the first phase meets light in the second phase;
      wherein light in the first phase is canceled at least in part by the light in the second phase;
      wherein a first width $D_2$ of unbroken transmitting area surrounds each of the plurality of transmitting nonprinting windows on all sides, the first width $D_2$ being sufficient for the unbroken transmitting area to print when the photomask is used to expose the photoresist and is between about 100 nm×S and 210 nm×S; and
   b) developing the photoresist to form a plurality of photoresist features, wherein the plurality of photoresist features are photoresist pillars;
   wherein the light projected onto the photoresist has an intensity specific to each point on the photoresist, each perimeter corresponds to a plurality of perimeter points on the photoresist, and at least a portion of the plurality of perimeter points has an intensity of zero;
   wherein each of the plurality of the borders corresponds to one of the plurality of photoresist features; and
   wherein the plurality of transmitting nonprinting windows is configured to form a nonprinting pattern that corresponds to a feature pattern formed by at least a portion of the photoresist features.

2. The method of claim 1 wherein the first phase is about 180 degrees and the second phase is about 0 degrees.

3. The method of claim 1 wherein the first phase is about 0 degrees and the second phase is about 180 degrees.

4. The method of claim 1 wherein the first width $D_2$ parallel to the plane of the photomask is between about 130 and 120 nm×S.

5. The method of claim 1 wherein the shortest linear dimension $D_1$ of any of the plurality of nonprinting transmitting windows parallel to the plane of the photomask is between about 130 and 140 nm×S.

6. The method of claim 1 wherein each of the plurality of transmitting nonprinting windows is rectangular.

7. The method of claim 1 further comprising etching to form a plurality of patterned pillars from the photoresist pillars.

8. The method of claim 7 wherein each of the plurality of patterned pillars comprises polysilicon.

9. The method of claim 7 wherein each of the plurality of patterned pillars is a portion of a memory cell.

* * * * *